United States Patent [19]
Shibib

[11] Patent Number: 5,670,396
[45] Date of Patent: Sep. 23, 1997

[54] METHOD OF FORMING A DMOS-CONTROLLED LATERAL BIPOLAR TRANSISTOR

[75] Inventor: Muhammed Ayman Shibib, Wyomissing, Pa.

[73] Assignee: Lucent Technologies Inc., Murray Hill, N.J.

[21] Appl. No.: 561,473

[22] Filed: Nov. 21, 1995

[51] Int. Cl.$^6$ ................................................ H01L 21/265
[52] U.S. Cl. ........................... 437/32; 437/31; 437/34; 437/59
[58] Field of Search .................. 437/31, 32, 34, 437/59, 917; 148/DIG. 96

[56] References Cited

U.S. PATENT DOCUMENTS

| | | | |
|---|---|---|---|
| 4,804,634 | 2/1989 | Krishna et al. | 437/32 |
| 5,027,184 | 6/1991 | Soclof | 357/49 |
| 5,043,786 | 8/1991 | Desilets et al. | 357/35 |
| 5,043,787 | 8/1991 | Soclof | 357/35 |
| 5,070,381 | 12/1991 | Scott et al. | 357/35 |
| 5,356,822 | 10/1994 | Lin et al. | 437/34 |

OTHER PUBLICATIONS

S. Verdonckt–Vandebroek et al., "A Complementary High Current Gain Transistor for use in a CMOS Compatible Technology", *IEEE 1990 Bipolar Circuits and Technology Meeting* 4.2, 1990, pp. 82–85.

S. Verdonckt–Vandebroek et al., "High–Gain Lateral Bipolar Action in a MOSFET Structure", *IEEE Transactions on Electron Devices*, vol. 38, No. 11, Nov. 1991, pp. 2487–2496.

S. Verdonckt–Vandebroek et al., "High–Gain Lateral p–n–p Bipolar Action in a p–MOSFET Structure", *IEEE Electron Device Letters*, vol. 13, No. 6, Jun. 1992, pp. 312–313.

S. Parke et al., "A High–Performance Lateral Bipolar Transistor Fabricated on SIMOX", *IEEE Electronics Device Letters*, vol. 14, No. 1, 1993, pp. 33–35.

R. Zambrano, "Improved Structures for Power MOSFETs With Full On–Chip Protection", *Fifth European Conference on Power Electronics and Applications on behalf of the European Power Electronics Assocation*, No. 377, vol. 2, Sep. 13–16, 1993, pp. 1–4.

M. Shibib et al., "A Cost–Effective Smart Power BiCMOS Technology", *Proceedings of The 7th International Symposium on Power Semiconductor Devices & ICs*, Yokohama, Japan, May 23–25, 1995, pp. 48–53.

J. Olsson et al., "High Current Gain Hybrid Lateral Bipolar Operation of DMOS Transistors", *IEEE Transactions on Electron Devices*, vol. 42, No. 9, Sep. 1995, pp. 1628–1634.

Primary Examiner—Tuan H. Nguyen

[57] ABSTRACT

DMOS-controlled lateral bipolar transistor comprises a first region of a first conductivity type for providing a collector, a second region of a second conductivity type opposite the first conductivity type for providing a base, a third region of the first conductivity type for providing an emitter, a dielectric on the second region, and an electrode on the dielectric wherein the electrode provides a gate for a DMOS transistor, the first region provides a drain for the DMOS transistor, the second region provides a channel region for the DMOS transistor, and the third region provides a source for the DMOS transistor.

20 Claims, 6 Drawing Sheets

METHOD OF FORMING A DMOS-CONTROLLED LATERAL BIPOLAR TRANSISTOR

FIELD OF THE INVENTION

The invention relates generally to transistors, and more particularly to lateral transistors.

BACKGROUND OF THE INVENTION

Bipolar transistors with high current gains (e.g., 100 or more) formed with conventional bipolar processes typically rely on narrow and/or lightly doped base regions so that a large number of minority carriers can diffuse from the emitter to the collector. Such base regions are often unable to sustain high voltages (e.g., 10–15 volts), leading to low collector-emitter and collector-base breakdown voltages. In various signal processing applications, however, it is desirable to have transistors with both high gains and high breakdown voltages.

Bipolar transistors tend to provide high speed, high current drive, and low noise at a cost of high power dissipation. CMOS transistors tend to have low power dissipation and high packaging density, but low current drive. Bipolar transistors can be fabricated using a CMOS process to obtain performance that exceeds that of circuits based exclusively on bipolar or CMOS technology. Fabricating bipolar transistors with CMOS processes is commonly known as BiCMOS processing.

Vertical bipolar transistors fabricated with BiCMOS processing are available with high-performance characteristics. However, fabricating vertical bipolar transistors using BiCMOS processes tends to be complicated and expensive. For instance, ten additional process steps may be necessary to fabricate vertical bipolar transistors with a CMOS process.

Lateral bipolar transistors can be formed in CMOS (or BiCMOS) processes by using source and drain diffusions for the collector and the emitter, and using a well of the opposite conductivity type as the base. Lateral bipolar transistors are based on inherent parasitics available to CMOS transistors, and can be fabricated with no additional processing steps or major modifications to a CMOS process. Therefore, lateral bipolar transistors can be fabricated relatively easily and economically with a CMOS process. Unfortunately, lateral bipolar transistors often have relatively low gain.

MOS-controlled lateral bipolar transistors are also known in the art. MOS-controlled lateral bipolar transistors typically include a gate formed over the base, with the collector as a drain and the emitter as a source. An appropriate gate voltage can result in a high gain for the lateral bipolar transistor. Other advantages of MOS-controlled lateral bipolar transistors include high emitter injection efficiency, short base transit time, and improved low temperature operation. See, for instance, S. Verdonckt-Vandebroek et al., "A Complementary High Current Gain Transistor for use in a CMOS Compatible Technology", *IEEE* 1990 *Bipolar Circuits and Technology Meeting* 4.2, 1990, pages 82–85; S. Verdonckt-Vandebroek et al., "High-Gain Lateral Bipolar Action in a MOSFET Structure", *IEEE Transactions on Electron Devices*, Vol. 38, No.11, November 1991, pages 2487–2496; S. Verdonckt-Vandebroek et al., "High-Gain Lateral p-n-p Bipolar Action in a p-MOSFET Structure", *IEEE Electron Device Letters*, Vol. 13, No. 6, June 1992, pages 312–313; S. Parke et al., "A High-Performance Lateral Bipolar Transistor Fabricated on SIMOX", *IEEE Electronics Device Letters*, Vol. 14, No. 1, 1993, pages 33–35; and R. Zambrano, "Improved Structures For Power MOS-FETs With Full On-Chip Protection", *Fifth European Conference on Power Electronics and Applications on behalf of the European Power Electronics Association*, No. 377, Vol. 2, Sep. 13–16, 1993, pages 1–4; which are incorporated herein by reference.

Although MOS-controlled lateral bipolar transistors with the gate tied to the base have been reported with gains exceeding 1000, a typical collector-base breakdown voltage is less than 10 volts. Accordingly, there remains a need for a high-gain, high-voltage lateral bipolar transistor.

SUMMARY OF THE INVENTION

A primary aspect of the invention is a DMOS-controlled lateral bipolar transistor.

In accordance with an embodiment of the invention, a DMOS-controlled lateral bipolar transistor comprises a first region of a first conductivity type for providing a collector, a second region of a second conductivity type opposite the first conductivity type for providing a base, a third region of the first conductivity type for providing an emitter, a dielectric on the second region, and an electrode on the dielectric wherein the electrode provides a gate for a DMOS transistor, the first region provides a drain for the DMOS transistor, the second region provides a channel region for the DMOS transistor, and the third region provides a source for the DMOS transistor. The DMOS transistor provides for a relatively high gain with a high collector-base and collector-emitter breakdown voltage.

The DMOS transistor, as used herein, is generally a double-diffused high-voltage metal-oxide semiconductor (MOS) field-effect transistor. The DMOS transistor is characterized by one edge defining a lateral diffusion edge for the channel region and the source. For example, a gate is deposited on an oxide on an N type substrate, a P type material is implanted into the N type substrate using an edge of the gate as a mask edge to form a P type well, the P type well is diffused into the N type substrate beneath the gate, an N type material is implanted into the P type well using the same edge of the gate as a mask edge to form an N type well, and the N type well is diffused into the P type well beneath the gate. The N type substrate provides a drain (and a collector), the N type well provides a source (and an emitter), and the P type well therebetween beneath the gate and adjacent to the oxide provides a channel region (and a base). In this instance, the edge of the self-aligned gate provides a lateral diffusion edge for both ends of the channel region. As a result, the channel region has a narrow length that is well controlled, which allows for a well-controlled depletion region and a relatively high punch-through (or breakdown) voltage. Therefore, the DMOS transistor provides a relatively high collector-emitter and collector-base breakdown voltage. Furthermore, the gate of the DMOS transistor can provide a channel (or inversion layer) in the channel region which increases the gain of the bipolar transistor.

Advantages of certain embodiments of the invention include a gain above 500, a collector-emitter breakdown voltage above 30 volts, and an early voltage of about 140 volts. In addition, the invention is easily fabricated using standard CMOS or BiCMOS processing technologies.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
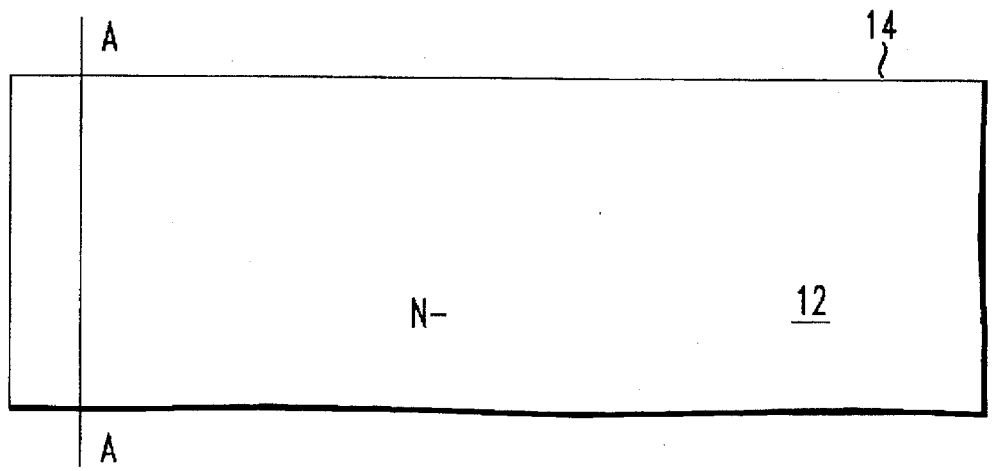
FIGS. 1–10 are cross-sectional views illustrating consecutive processing steps used to fabricate a DMOS-controlled lateral bipolar transistor according to an embodiment of the invention.

FIGS. 1–10 are cross-sectional views illustrating consecutive processing steps used to fabricate DMOS-controlled lateral bipolar transistor 10 in accordance with an embodiment of the invention. As used herein, the "structure" refers to the device as fabricated in the previous processing steps. It is understood that the drawing is not to scale for convenience of explanation.

In FIG. 1, substrate 12 provides the starting material for the fabrication process. Substrate 12 is composed of <100> oriented crystalline silicon lightly doped N-type to a conductivity of approximately 10 ohms-cm. Substrate 12 defines an upper surface 14. Substrate 12 may be an N-type region deposited or diffused in a larger P type wafer (not shown). Substrate 12 is preferably a portion of an integrated circuit chip in which transistor 10 is contained. Substrate 12 provides a collector for transistor 10. For brevity, the region within lateral gap A is not shown to omit mirror images of certain features, as further explained below.

Figure 2:
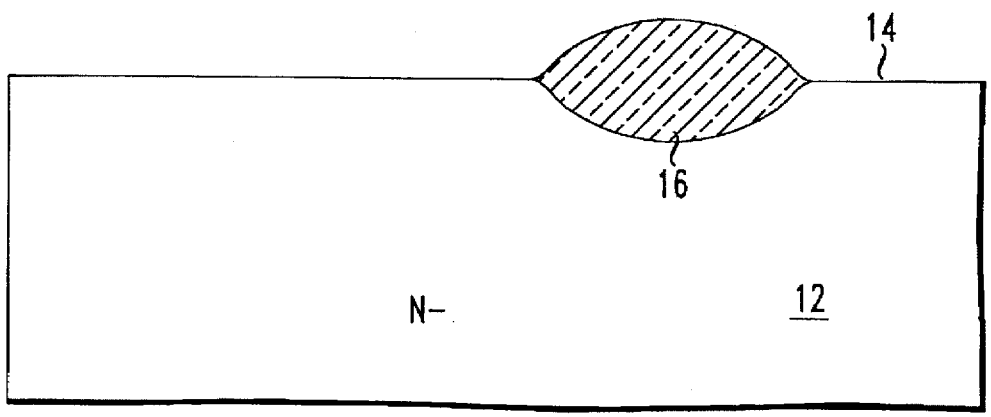

In FIG. 2, a layer of silicon dioxide 16 is formed on part of surface 14. Initially, a pad layer of silicon dioxide (not shown) is formed by thermal oxidation on surface 14 by placing substrate 12 in an oxidizing ambient at a temperature of approximately 1000° C. for approximately 20 minutes. Thereafter, a layer of nitride (not shown) is deposited on the pad oxide by low pressure chemical vapor deposition, and the nitride and pad oxide are patterned by wet chemical etching using a first photoresist mask (not shown). Next, Silicon dioxide 16 is formed by thermal oxidation on the exposed portion of surface 14, but not on the nitride, by placing the structure in an oxidizing ambient at a temperature of approximately 1100° C. for approximately 2 hours. The nitride on surface 14 is then removed by wet chemical etching. Silicon dioxide 16 has sloping vertical edges and is relatively thick, with a typical thickness in the range of 0.6 to 1.5 micrometers. In addition, the portion of surface 14 below silicon dioxide 16 recedes.

Figure 3:
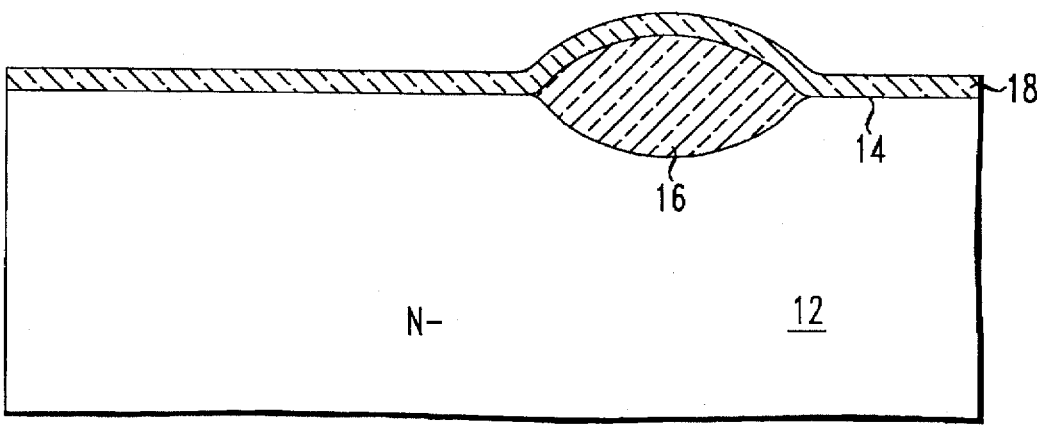

In FIG. 3, a blanket layer of silicon dioxide 18 is formed on the exposed upper surfaces. Initially, a sacrificial layer of silicon dioxide (not shown) is formed by thermal oxidation on the exposed upper surfaces by placing the structure in an oxidizing ambient at a temperature of approximately 1000° C. for approximately 20 minutes. The sacrificial layer is then removed using wet chemical etching in hydrofluoric acid. Removing the sacrificial layer provides surface preparation by removing surface defects. Next, a high quality layer of silicon dioxide 18 is formed by thermal oxidation on the exposed upper surfaces by placing the structure in an oxidizing ambient at a temperature of approximately 1000° C. for approximately 20 minutes. Silicon dioxide 18 is relatively thin, with a relatively uniform thickness in the range of 200 to 1000 angstroms.

Figure 4:
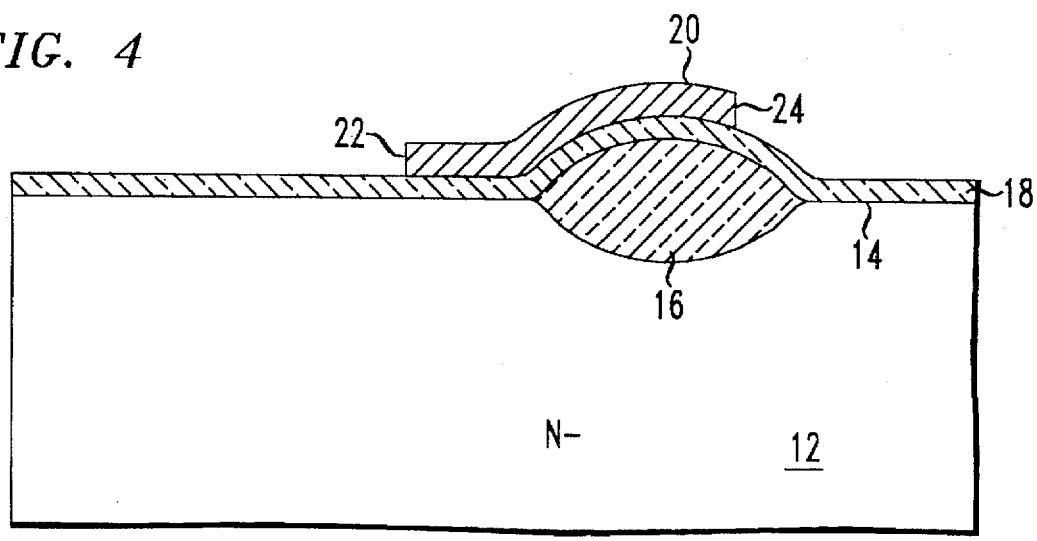

In FIG. 4, a layer of polycrystalline silicon or polysilicon 20 with vertical edges 22 and 24 is formed on a portion of silicon dioxide 18. The formation includes conformally depositing a layer of polysilicon on silicon dioxide 18 using low pressure chemical vapor deposition, heavily doping the polysilicon to N+ type using one of several techniques, such as ion implantation or in situ doping with phosphorus, and patterning the doped polysilicon by plasma etching through a second photoresist mask (not shown). As is seen, polysilicon edge 22 is disposed outside silicon dioxide 16, whereas polysilicon edge 24 is disposed above silicon dioxide 16. Polysilicon 20 provides a gate for a DMOS transistor.

Figure 5:
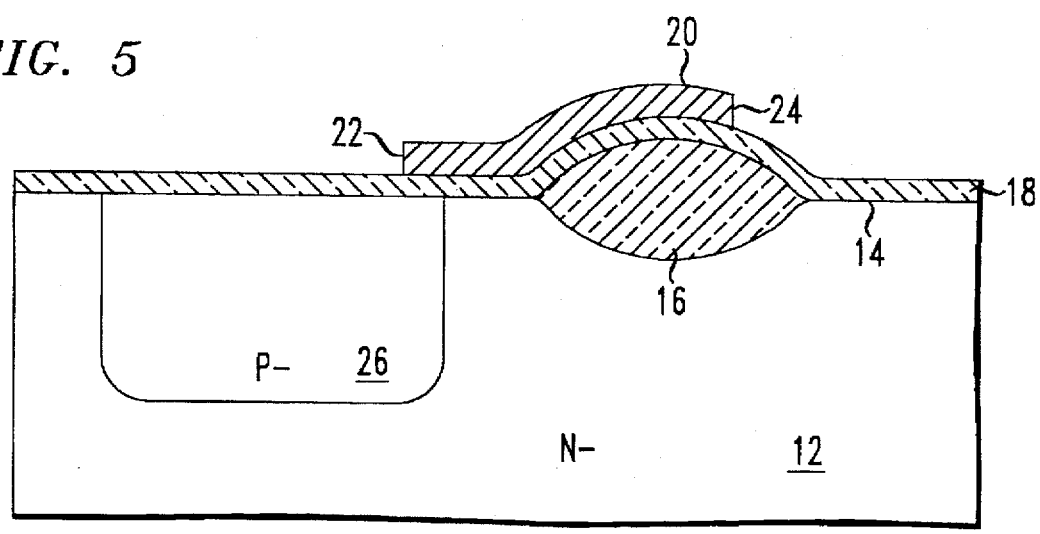

In FIG. 5, lightly doped P− type region 26 is formed in substrate 12. P− type region 26 is defined by a third photoresist mask (not shown) in conjunction polysilicon 20 such that polysilicon edge 22 defines the right edge of the mask opening. The structure is subjected to an ion implantation of P type ions such as boron having an energy of approximately 60 Kiloelectron-Volts at a density of approximately $6 \cdot 10^{13}$ ions/cm$^2$. Silicon dioxide layer 18 is sufficiently thin that the P type ions pass through it and penetrate surface 14. After implantation, the third mask is removed, and the structure is annealed at 1200° C. for 1 hour in an inert ambient so that P− type region 26 is driven in and laterally diffuses beneath polysilicon 20. Thus, P− type region 26 forms a well (or tub) in substrate 12 that extends to surface 14. P− type region 26 provides a base for transistor 10 and a body for the DMOS transistor.

Figure 6:
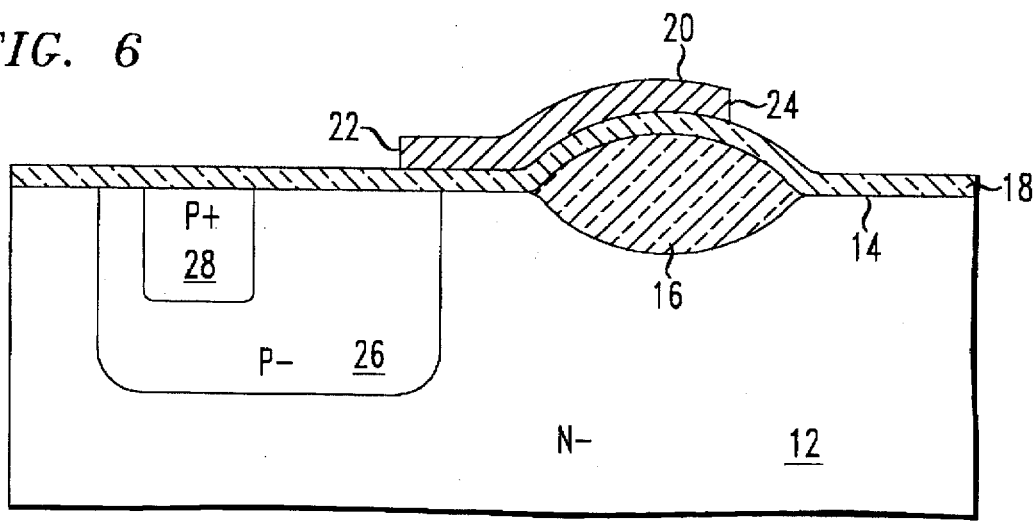

In FIG. 6, heavily doped P+ type region 28 is formed in P− type region 26 by subjecting the structure to an ion implantation of P type ions such as boron having an energy of approximately 60 Kiloelectron-Volts at a density of approximately $5 \cdot 10^{15}$ ions/cm$^2$ through a fourth photoresist mask (not shown). Thus, P+ type region 28 forms a well (or tub) in P− type region 26 that extends to surface 14. P+ type region 28 provides a base contact in ohmic contact with P− type region 26.

Figure 7:
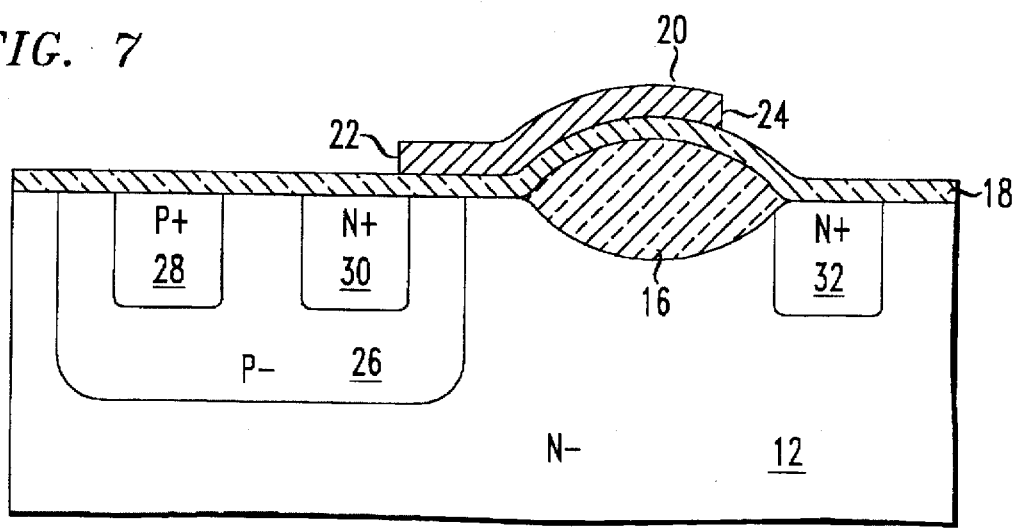

In FIG. 7, heavily doped N+ type region 30 is formed in P− type region 26, and heavily doped N+ type region 32 is simultaneously formed in substrate 12. N+ type region 30 is defined by a first opening in a fifth photoresist mask (not shown) in conjunction polysilicon 20 such that polysilicon edge 22 defines the right edge of the first opening. N+ type region 32 is defined by a second opening in the fifth photoresist mask. The structure is subjected to an ion implantation of N type ions such as phosphorus having an energy of approximately 60 Kiloelectron-Volts at a density of approximately $3 \cdot 10^{15}$ ions/cm$^2$. Silicon dioxide layer 18 is sufficiently thin that the N type ions pass through it and penetrate surface 14. N+ type region 32 is implanted outside silicon dioxide 16, which masks the ions. After implantation, the fifth mask is removed, and the structure is annealed at 1000° C. for 1 hour in an oxidizing ambient so that N+ type regions 30 and 32 are driven in. The anneal causes N+ type region 30 to laterally diffuse beneath polysilicon 20, and N+ type region 32 to laterally diffuse beneath silicon dioxide 16. The anneal also causes P− type region 26 to further laterally diffuse beneath polysilicon 20.

Thus, N+ type regions 30 and 32 each forms a well (or tub) that extends to surface 14. P− type region 26 is adjacent to both N+ type region 30 and substrate 12 at surface 14 beneath polysilicon 20. Accordingly, the channel length and the lateral base width are precisely controlled by using polysilicon edge 22 as a self-aligned lateral diffusion edge for the diffusions of P− type region 26 and N+ type region 30 beneath polysilicon 20. N+ type region 30 provides an emitter for transistor 10, as well as an emitter contact. N+ type region 32 provides a collector contact in ohmic contact with substrate 12. The depth of P− type region 26 is approximately 4 micrometers, the depths of P+ type region 28 and N+ type regions 30 and 32 are approximately 1.5 micrometers, and the length of P− type region 26 between N+ type region 30 and substrate 12 at surface 14 (i.e., the channel region) is approximately 2 micrometers.

Figure 8:
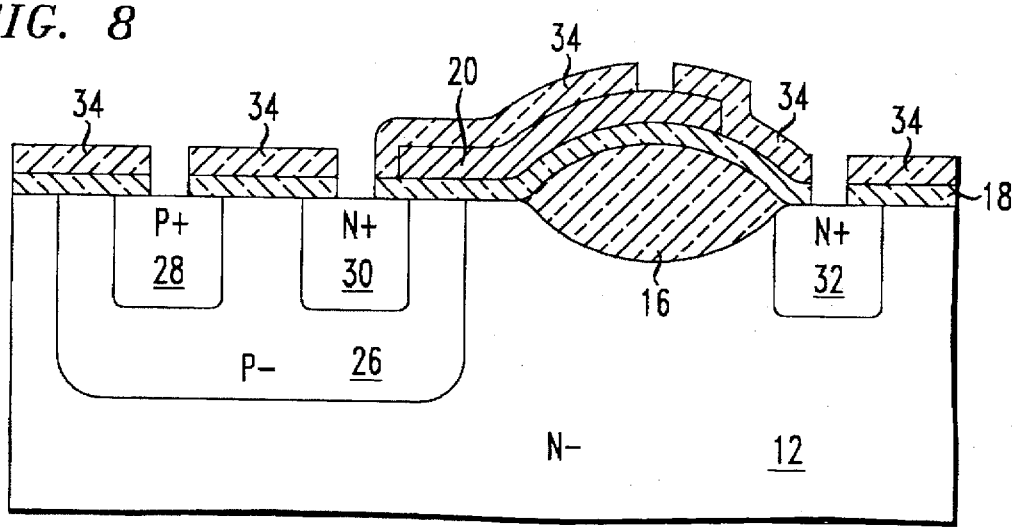

In FIG. 8, a layer of protective glass is formed on the structure. A blanket layer of boron phosphor silicate glass (BPSG) 34 is deposited by low pressure chemical vapor deposition over the exposed upper surfaces, and densified in an oxidizing ambient at 900° C. for 30 minutes. Glass 34 has a thickness in the range of 1.0 to 1.5 micrometers. Glass 34 is then anisotropically patterned by applying a plasma etch through openings in a sixth photoresist mask (not shown). The plasma etch also anisotropically etches the exposed portions of silicon dioxide 18 directly beneath the etched portions of glass 34. This forms contact windows above portions of regions 28, 30, 32, and polysilicon 20. The contact windows have narrow line widths of approximately 5 micrometers.

Figure 9:
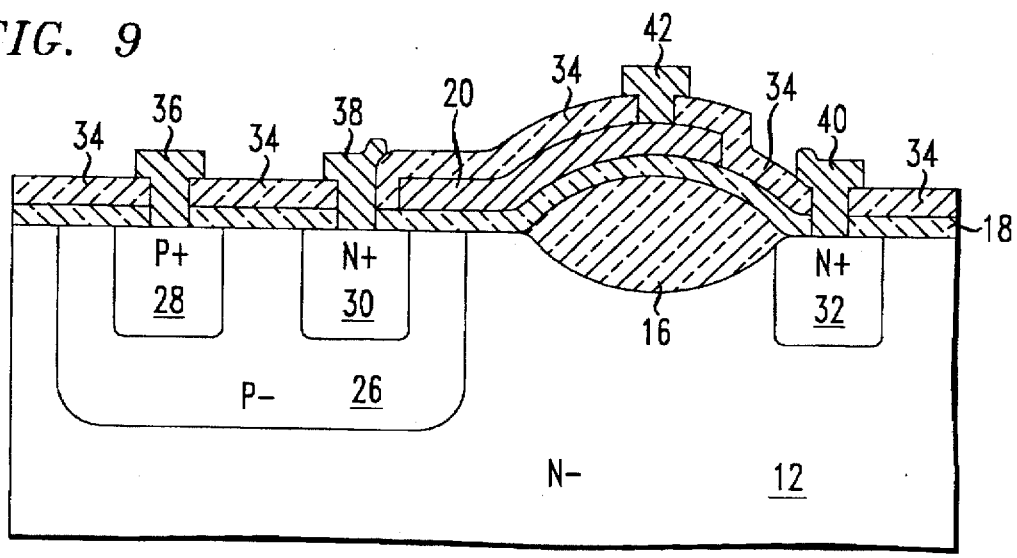

In FIG. 9, aluminum terminals are formed in the contact windows. Initially, a blanket layer of aluminum is sputter deposited onto the exposed upper surfaces. The aluminum fills the contact windows. Then, portions of the aluminum outside the contact windows are removed by plasma etching through a seventh photoresist mask (not shown). As a result, aluminum terminals 36, 38, 40 and 42 are electrically coupled to regions 28, 30 and 32 and polysilicon 20, respectively. Aluminum terminal 36 provides a base terminal, aluminum terminal 38 provides an emitter terminal, aluminum terminal 40 provides a collector terminal, and aluminum terminal 42 provides a gate terminal. The aluminum terminals may be interconnected by additional metallization (not shown) to other circuits in an integrated circuit embodying transistor 10.

Figure 10:
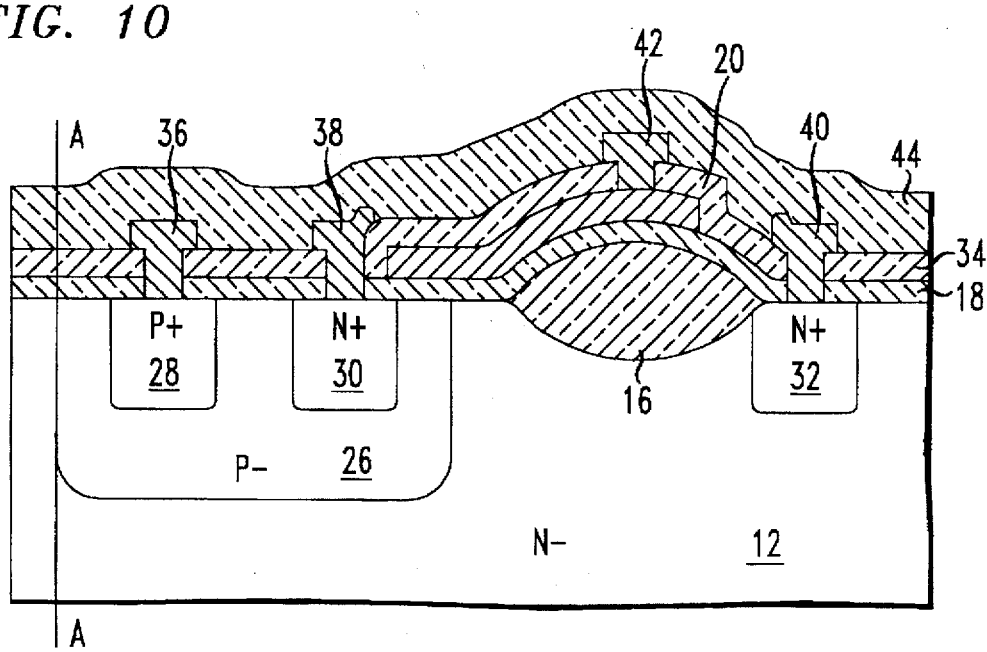

In FIG. 10, a layer of silicon nitride 44 is deposited on the exposed upper surfaces of the structure, and then removed at portions (not shown) using a plasma etch through an eighth photoresist mask (not shown). Silicon nitride 44 provides a passivation layer.

Thus, transistor 10 is fabricated. Advantageously, only eight mask steps are used. Although not essential, it is preferred that transistor 10 be constructed in a process that includes dielectric isolation as set forth in M. Shibib et al., "A Cost-Effective Smart Power BiCMOS Technology", *Proceedings of The 7th International Symposium on Power Semiconductor Devices & ICs*, Yokohama, Japan, May 23–25, 1995, pages 48–53, which is incorporated herein by reference.

Of course, many variations to the fabrication process of FIGS. 1–10 will be apparent to those skilled in the art. For instance, other gate dielectrics (including a single dielectric of uniform or varying thickness) may replace silicon dioxide 16 and 18, other protective dielectrics may replace glass 34 and silicon nitride 44, other conductive electrodes may replace polysilicon 20, and other conductive terminals may replace aluminum terminals 36, 38, 40 and 42. The N type and P type materials may be replaced by P type and N type materials, respectively. Furthermore, silicon nitride 44 (and the passivation layer generally) may be omitted thereby reducing the process to seven mask steps. Other deposition and patterning techniques can be used. For instance, an edge of silicon nitride sandwiched between silicon dioxide 16 and silicon dioxide 18 can provide the lateral diffusion edge for P− type region 26 and N+ type region 30 before polysilicon 20 is formed. Other edges integral to the structure can provide the lateral diffusion edge. Likewise, the sequence of steps can be altered. For instance, N+ type regions 30 and 32 can be formed before P+ type region 28 is formed. Other geometries can be used. In an alternative configuration, it may be desirable for polysilicon 20 to directly contact P+ type region 28 or N+ type region 30. In addition, more processing steps may be included, for instance, a thin titanium-tungsten barrier layer may be sputter deposited into the contact windows prior to depositing the aluminum terminals.

Figure 11:
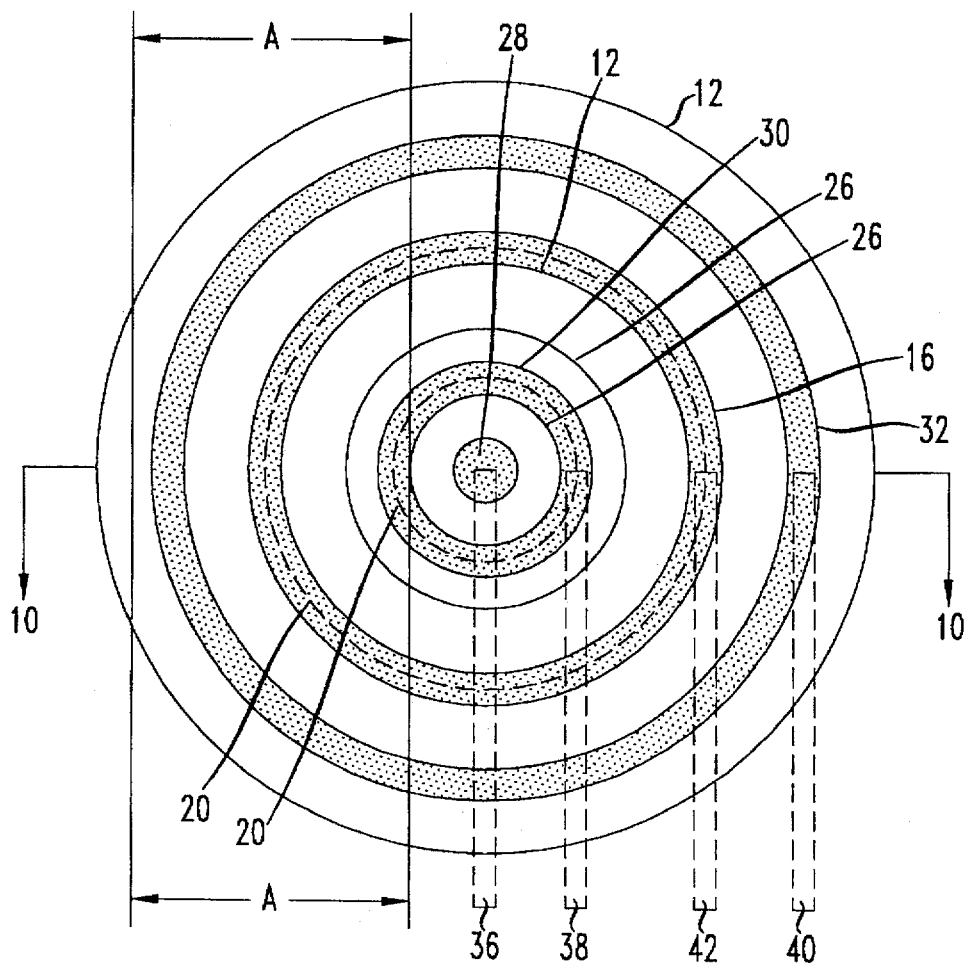
FIG. 11 is a top plan view of a DMOS-controlled lateral bipolar transistor according to an embodiment of the invention.

FIG. 11 is a top plan view of transistor 10. Substrate 12, silicon dioxide 16, and regions 26, 28, 30 and 32 along surface 14 (excluding the recessed portion of surface 14 below silicon dioxide 16) are shown as solid lines. Polysilicon 20 and aluminum terminals 36, 38, 40 and 42 above surface 14 are shown as broken lines. Silicon dioxide 18, glass 34, and silicon nitride 44 are omitted for clarity. The mirror images of silicon dioxide 16, polysilicon 20, and N+ type regions 30 and 32, which occur in gap A, are also shown. As mentioned above, the region in gap A is omitted in FIGS. 1–10 for brevity. Furthermore, although not shown, it may be desirable to dispose terminals 36, 38, 40 and 42 in a radially outward configuration in order to reduce their length.

Transistor 10, being a lateral bipolar NPN transistor, further includes (or incorporates) an N− channel DMOS transistor, for which substrate 12 provides the drain, polysilicon 20 provides the gate, N+ type region 30 provides the source, and P− type region 26 between N+ type region 30 and substrate 12 at (and below) surface 14 provides the channel region. Thus, the collector is coupled to the drain, the emitter is coupled to the source, and the channel region is formed in the base. Transistor 10 may be a three-terminal or four-terminal device, depending on whether the gate is accessible as a separate terminal. If the gate is not accessible as a separate terminal, it is preferred that the gate be electrically coupled to either the base or the emitter. For instance, the gate can be electrically coupled to the emitter by omitting aluminum 42 and its contact window and widening the contact window for aluminum 38 so that aluminum 38 also contacts polysilicon 20.

Figure 12:
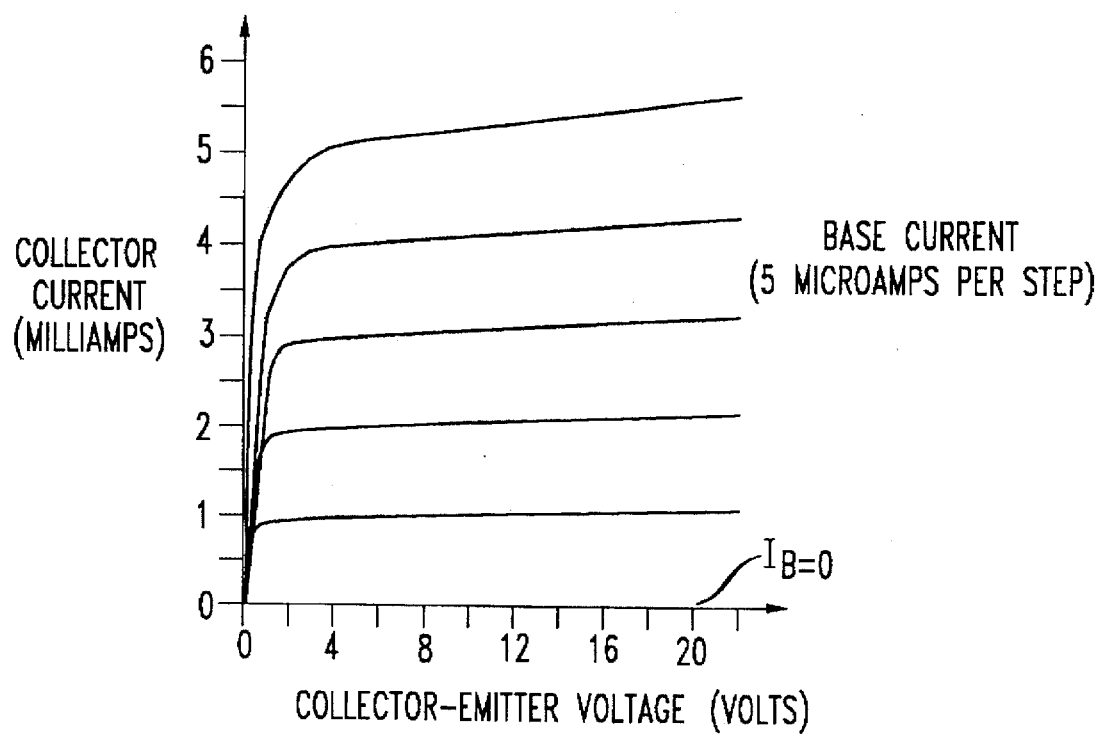
FIGS. 12–14 show the current-voltage characteristics of a DMOS-controlled lateral bipolar transistor according to an embodiment of the invention.
Figure 13:
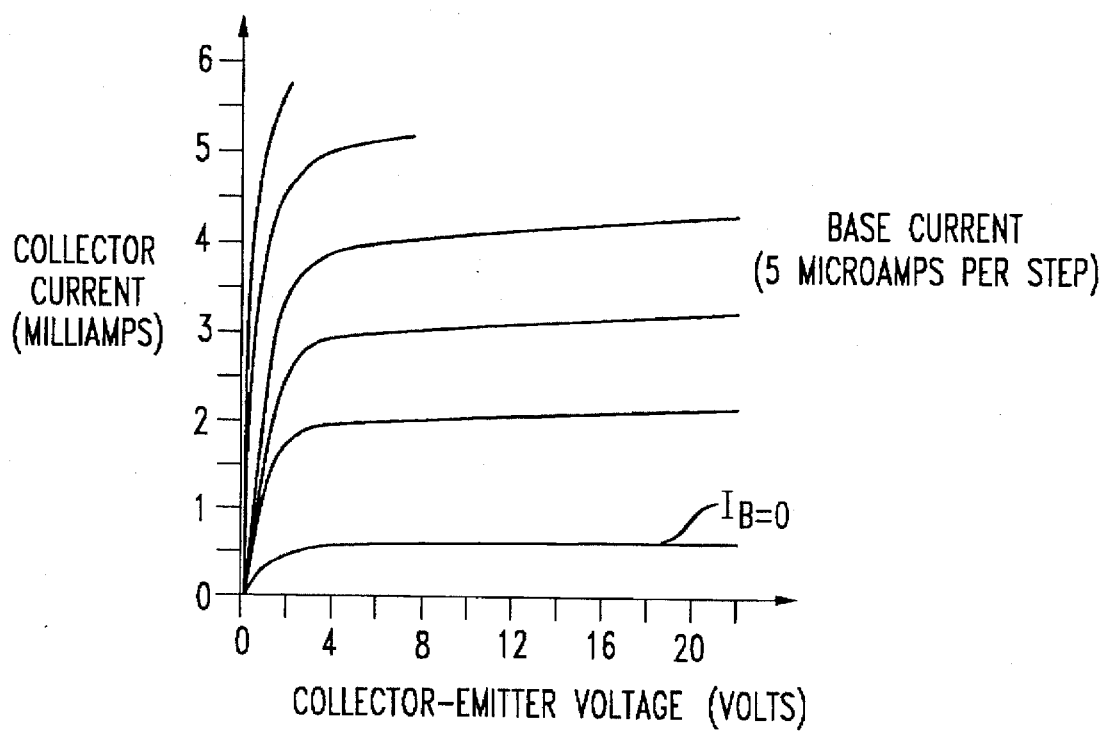
Figure 14:
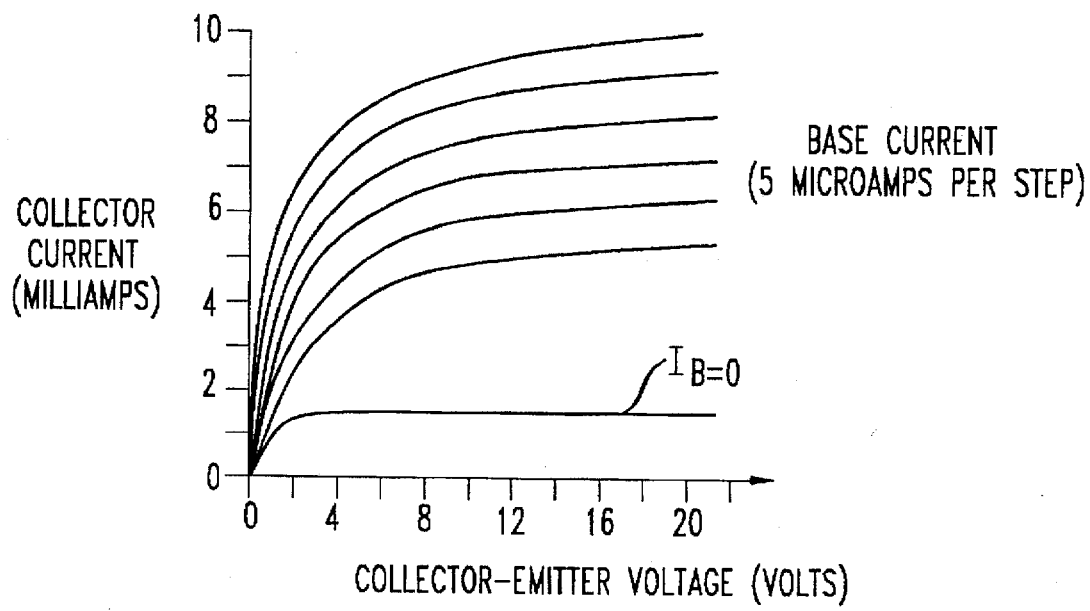

FIGS. 12–14 show the current-voltage characteristics for transistor 10. In FIG. 12, the gate-to-source voltage is 0 volts. In FIG. 13, the gate-to-source voltage is 2 volts, and in FIG. 14 the gate-to-source voltage is increased to 5 volts. The various curves in each plot are associated with increased base current. As is seen, increasing the gate-to-source voltage increases the collector current for transistor 10 when, for instance, the base current is held at 10 microamps (two curves above $I_B$=0). Thus, the gate voltage controls the bipolar current gain (beta) of transistor 10. Apparently, when the gate voltage induces a channel in the channel region, the channel current (as well as the base current) gets multiplied, and the effective (or quasineutral) lateral base width is decreased thereby increasing the current gain. The collector current is determined mainly by electrons injected from the emitter into the collector depletion layer, whereas the base current is determined mainly by holes injected from the quasineutral portion of the base into the emitter. Furthermore, the barrier for electron injection into the base is smaller than the barrier for holes injected into the emitter, which results in high current gain. It is understood that the success of the invention does not depend on the accuracy of the semiconductor physics explanation herein. A more exhaustive explanation of the semiconductor physics for MOS-controlled lateral bipolar transistors is set forth in the references by S. Verdonckt-Vandebroek et al., supra.

Transistor 10 also has a relatively high collector-emitter breakdown voltage. For instance, with the gate electrically coupled to the emitter, and a collector current of 500 microamps, transistor 10 has a gain of approximately 500, an early voltage of approximately 140 volts, a DMOS threshold voltage of approximately 3.0 volts, a base-emitter breakdown voltage of approximately 13 volts, a collector-base breakdown voltage of approximately 45 volts, and a collector-emitter breakdown voltage of approximately 35 volts.

Other transistors fabricated in accordance with the invention, with the gate electrically coupled to the emitter, exhibited a collector-base breakdown voltage of about 120 volts, and a collector-emitter breakdown voltage of about 70 volts. By electrically coupling the gate to the emitter, instead of to the base, these transistors exhibited a dramatic increase in collector-base and collector-emitter breakdown voltages, yet retained almost the same enhancement to the gain.

The relatively high collector-emitter breakdown voltage for transistor 10 is due in part to the shape of polysilicon 20. In particular, silicon dioxide 16 and 18 form a composite dielectric with a first thickness (the combined thickness of silicon dioxide 16 and 18) over a portion substrate 12 at surface 14, and a second thickness (the thickness of silicon dioxide 18) over P− type region 26 at surface 14. The first thickness is substantially larger than the second thickness, and there is a gradual slope between the first and second thicknesses. Polysilicon 20 conforms to the shape of the underlying dielectric. As a result, polysilicon 20 provides a field plate. That is, when polysilicon 20 and substrate 12 are at different potentials, the electric field in substrate 12 at (or near) surface 14 below polysilicon 20 is substantially less than what it would be if the entire dielectric had the second thickness (with polysilicon 20 a uniform height of the second thickness above substrate 12). The reduced electric field (or voltage gradient) greatly relieves stress in substrate 12, thereby increasing the punch-through voltage for the DMOS transistor and increasing the collector-emitter breakdown voltage for transistor 10. MOS transistors with field plate gates are known to those skilled in the art.

The collector-emitter breakdown voltage of transistor 10 can be further increased by increasing the lateral distance between N+ type region 32 and P− type region 26, although this may increase the surface area of transistor 10. Alternatively, the collector-emitter breakdown voltage of transistor 10 can be further increased by increasing the doping of P− type region 26, and decreasing the doping of N− type substrate 12, although this may increase the threshold voltage for the DMOS transistor.

Figure 15:
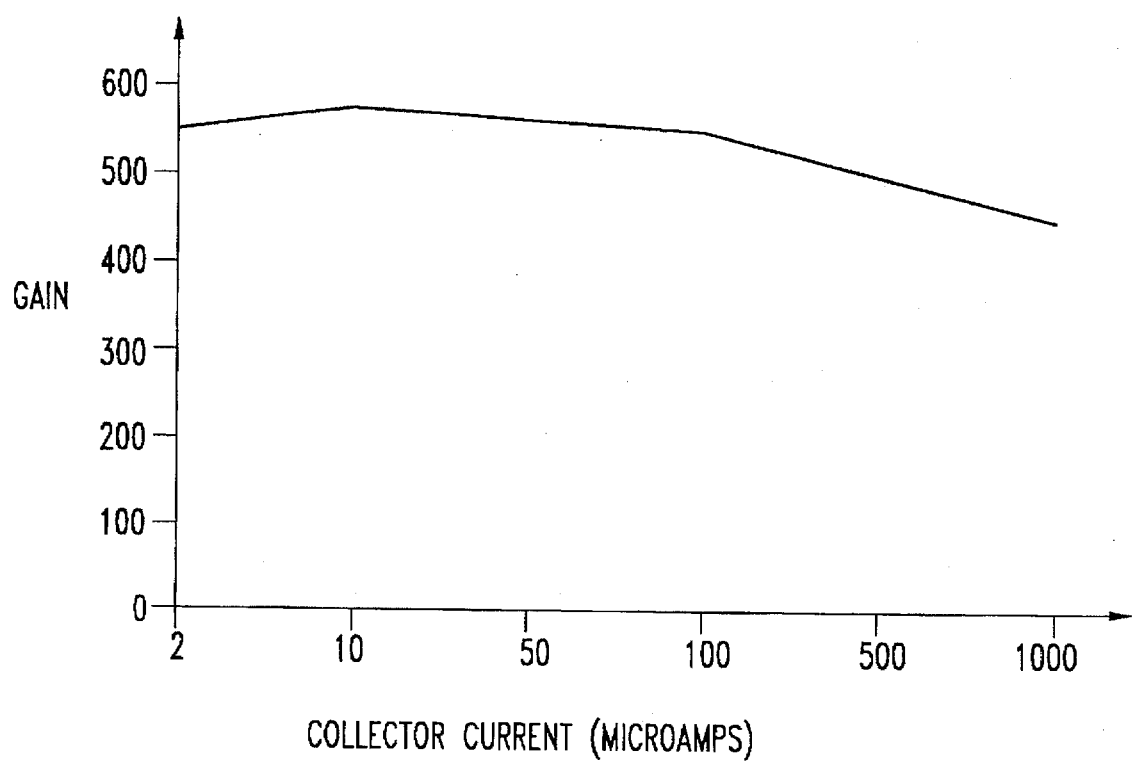
FIG. 15 shows the current-gain characteristics of a DMOS-controlled lateral bipolar transistor according to an embodiment of the invention.

FIG. 15 shows the gain of transistor 10 as a function of collector current. As is seen, the gain remains relatively flat, and in excess of 500, over a wide range of collector currents.

An experimental distribution for other transistors fabricated in accordance with the invention indicates a gain in a range of approximately 250 to 300 for collector-base breakdown voltages in a range of approximately 70 to 110 volts.

It is understood that while the present invention has been described in terms of several illustrative embodiments, other arrangements and methods of operation will be apparent to those of ordinary skill in the art. For example, the embodiments can be incorporated into general-purpose processors, special-purpose integrated circuits, digital signal processors, or discrete transistor devices. Of course, the invention can be implemented as a PNP transistor in which the emitter provides the source and the collector provides the drain. Finally, the present invention can be used in virtually any application where a transistor is desired. Therefore, the invention should be limited only by the spirit and scope of the appended claims.

The invention claimed is:
1. A method of making a DMOS-controlled lateral bipolar transistor comprising the steps of:
   providing a first region having a first conductivity type and a top surface;
   forming a dielectric over a portion of the top surface;
   forming an electrode over a portion of the dielectric and a portion of the top surface;
   introducing a dopant having a second conducting type opposite the first conductivity type into the first region, using an edge of the electrode to partially define a first mask opening, to form a second region of second conductivity type in the first region;
   diffusing the second region into the first region such that the second region extends into the first region beneath the electrode and is adjacent to the first region at the top surface beneath the electrode;
   introducing a first conductivity type dopant into the second region using the edge of the electrode to partially define a second mask opening to form a third region of the first conductivity type in the second region;
   diffusing the third region into the second region without diffusing the third region into the first region such that the third region extends into the second region beneath the electrode; and
   forming first, second, third and fourth conductors on the first, second and third regions, and on the electrode, respectively, to form collector, base, emitter, and gate terminals, respectively;
   wherein the electrode forms a gate for a DMOS transistor, the first region forms a collector for the bipolar transistor and a drain for the DMOS transistor, the second region forms a base for the bipolar transistor and a channel region for the DMOS transistor, and the third region forms an emitter for the bipolar transistor and a source for the DMOS transistor.

2. The method of claim 1 in which the first conductivity type is N and the second conductivity type is P.

3. The method of claim 1 in which the dielectric includes an oxide and the electrode includes polysilicon.

4. The method of claim 1 in which a collector-emitter breakdown voltage is at least 30 volts.

5. The method of claim 1 in which the first, second, third and fourth conductors include aluminum.

6. The method of claim 1 in which the fourth conductor is electrically coupled to the electrode.

7. The method of claim 1, wherein the dielectric includes a first dielectric region having a first thickness, and a second dielectric region having a second thickness, the first dielectric region is formed over a portion of the first region at the top surface, the second dielectric region is formed over the second region at the top surface, the first thickness is thicker than the second thickness, and the electrode is formed over portions of the first and second dielectric regions.

8. The method of claim 1, wherein the dielectric includes a first dielectric layer and a second dielectric layer, the first dielectric layer has a first thickness, and the second dielectric layer has a second thickness greater than the first thickness.

9. The method of claim 1, further comprising the steps of:
   introducing a dopant having the first conductivity type into the first region to form a fourth region of first conductivity type in the first region; and
   diffusing the fourth region into the first region such that the fourth region extends into the first region beneath a thickened portion of the dielectric.

10. The method of claim 9 further comprising the steps of:
introducing a dopant having the second conductivity type, into the second region to form a fifth region having the second conductivity type in the second region; and
diffusing the fifth region into the second region without diffusing the fifth region into the first region.

11. A method of making a DMOS-controlled lateral bipolar transistor comprising the steps of:
providing a first region having a first conductivity type and a top surface;
forming a dielectric over a portion of the top surface, the dielectric having a thickened portion;
forming an electrode over a portion of the dielectric and a portion of the top surface;
introducing a dopant having a second conducting type opposite the first conductivity type into the first region, using an edge of the electrode to partially define a first mask opening, to form a second region of second conductivity type in the first region;
diffusing the second region into the first region such that the second region extends into the first region beneath the electrode and is adjacent to the first region at the top surface beneath the electrode;
introducing a first conductivity type dopant into the second region using the edge of the electrode to partially define a second mask opening to form a third region of the first conductivity type in the second region;
diffusing the third region into the second region without diffusing the third region into the first region such that the third region extends into the second region beneath the electrode;
introducing a dopant having the first conductivity type into the first region to form a fourth region of first conductivity type in the first region;
diffusing the fourth region into the first region such that the fourth region extends into the first region beneath the thickened portion of the dielectric; and
forming first, second, third and fourth conductors on the second, third and fourth regions, and on the electrode, respectively, to form base, emitter, collector and gate terminals, respectively;
wherein the electrode forms a gate for a DMOS transistor, the fourth region forms a collector for the bipolar transistor and a drain for the DMOS transistor, the second region forms a base for the bipolar transistor and a channel region for the DMOS transistor, and the third region forms an emitter for the bipolar transistor and a source for the DMOS transistor; and
wherein the electrode is formed over portions of the first and second regions and does not extend over the fourth region.

12. The method of claim 11 in which the first conductivity type is N and the second conductivity type is P.

13. The method of claim 11 in which the dielectric includes an oxide and the electrode includes polysilicon.

14. The method of claim 11 in which a collector-emitter breakdown voltage is at least 30 volts.

15. The method of claim 11 wherein the first, second, third and fourth conductors include aluminum.

16. The method of claim 11 wherein the fourth conductor is electrically coupled to the electrode.

17. The method of claim 11, wherein the dielectric includes a first dielectric region comprising the thickened portion, the first dielectric region having a first thickness, and a second dielectric region having a second thickness, the first dielectric region is formed over a portion of the first region at the top surface, the second dielectric region is formed over the second region at the top surface, the first thickness is thicker than the second thickness, and the electrode is formed over portions of the first and second dielectric regions.

18. The method of claim 11, wherein the dielectric includes a first dielectric layer and a second dielectric layer, the first dielectric layer has a first thickness, and the second dielectric layer has a second thickness greater than the first thickness.

19. The method of claim 11 further comprising the steps of:
introducing a dopant having the second conductivity type, into the second region to form a fifth region having the second conductivity type in the second region; and
diffusing the fifth region into the second region without diffusing the fifth region into the first region.

20. A method of making an annular DMOS-controlled lateral bipolar transistor comprising the steps of:
providing a first region having a first conductivity type and a top surface;
forming a dielectric over a portion of the top surface, the dielectric having a thickened portion;
forming an electrode over a portion of the dielectric and a portion of the top surface;
introducing a dopant having a second conducting type opposite the first conductivity type into the first region, using an edge of the electrode to partially define a first mask opening, to form a second region of second conductivity type in the first region;
diffusing the second region into the first region such that the second region extends into the first region beneath the electrode and is adjacent to the first region at the top surface beneath the electrode;
introducing a first conductivity type dopant into the second region using the edge of the electrode to partially define a second mask opening to form a third region of the first conductivity type in the second region;
diffusing the third region into the second region without diffusing the third region into the first region such that the third region extends into the second region beneath the electrode;
introducing a dopant having the first conductivity type into the first region to form a fourth region of first conductivity type in the first region;
diffusing the fourth region into the first region such that the fourth region extends into the first region beneath the thickened portion of the dielectric; and
forming first, second, third and fourth conductors on the second, third and fourth regions, and on the electrode, respectively, to form base, emitter, collector and gate terminals, respectively;
wherein the electrode forms a gate for a DMOS transistor, the fourth region forms a collector for the bipolar transistor and a drain for the DMOS transistor, the second region forms a base for the bipolar transistor and a channel region for the DMOS transistor, and the third region forms an emitter for the bipolar transistor and a source for the DMOS transistor;
wherein the electrode is formed over portions of the first and second regions and does not extend over the fourth region; and
wherein the DMOS-controlled lateral bipolar transistor has an annular structure.

* * * * *